(12) United States Patent
Nakatani

(10) Patent No.: US 8,276,449 B2
(45) Date of Patent: Oct. 2, 2012

(54) ACCELERATION SENSOR AND METHOD OF MANUFACTURING ACCELERATION SENSOR

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 464 days.

(21) Appl. No.: 12/585,553

(22) Filed: Sep. 17, 2009

(65) Prior Publication Data

US 2010/0064808 A1    Mar. 18, 2010

(30) Foreign Application Priority Data

Sep. 18, 2008  (JP) .................... 2008-239553

(51) Int. Cl.
 *G01P 15/12* (2006.01)
 *G01P 15/00* (2006.01)
(52) U.S. Cl. .................. 73/514.33; 73/514.38
(58) Field of Classification Search ............. 73/514.33, 73/514.34, 514.01, 514.38; 438/401; 257/513–517, 257/686
See application file for complete search history.

(56) References Cited

U.S. PATENT DOCUMENTS

| | | | |
|---|---|---|---|
| 6,703,679 B1 * | 3/2004 | Lemkin et al. ............. 257/513 |
| 6,892,579 B2 * | 5/2005 | Ohtoyo et al. ........... 73/514.33 |
| 7,111,514 B2 * | 9/2006 | Hatano et al. ........... 73/514.33 |
| 7,192,839 B1 * | 3/2007 | Ramkumar et al. ......... 438/401 |
| 7,322,239 B2 * | 1/2008 | Kurogi ................. 73/514.01 |
| 7,389,691 B2 * | 6/2008 | Kai .................... 73/514.36 |
| 7,598,118 B2 * | 10/2009 | Sugiura et al. ............ 438/106 |
| 2007/0102831 A1 * | 5/2007 | Machida et al. ............ 257/787 |

FOREIGN PATENT DOCUMENTS

JP   2005-351716 A   12/2005

* cited by examiner

*Primary Examiner* — Helen C. Kwok
(74) *Attorney, Agent, or Firm* — Rabin & Berdo, P.C.

(57) ABSTRACT

The acceleration sensor according to the present invention includes a sensor chip having a movable portion operating in response to a change in a physical quantity and a silicon chip arranged to be opposed to a first side of the sensor chip and bonded to the sensor chip, while the sensor chip is provided with a penetrating portion penetrating the sensor chip in the thickness direction so that the first side is visually recognizable from a second side of the sensor chip, and the silicon chip is provided with an alignment mark on a portion opposed to the penetrating portion.

13 Claims, 10 Drawing Sheets

FIG. 2
(a) 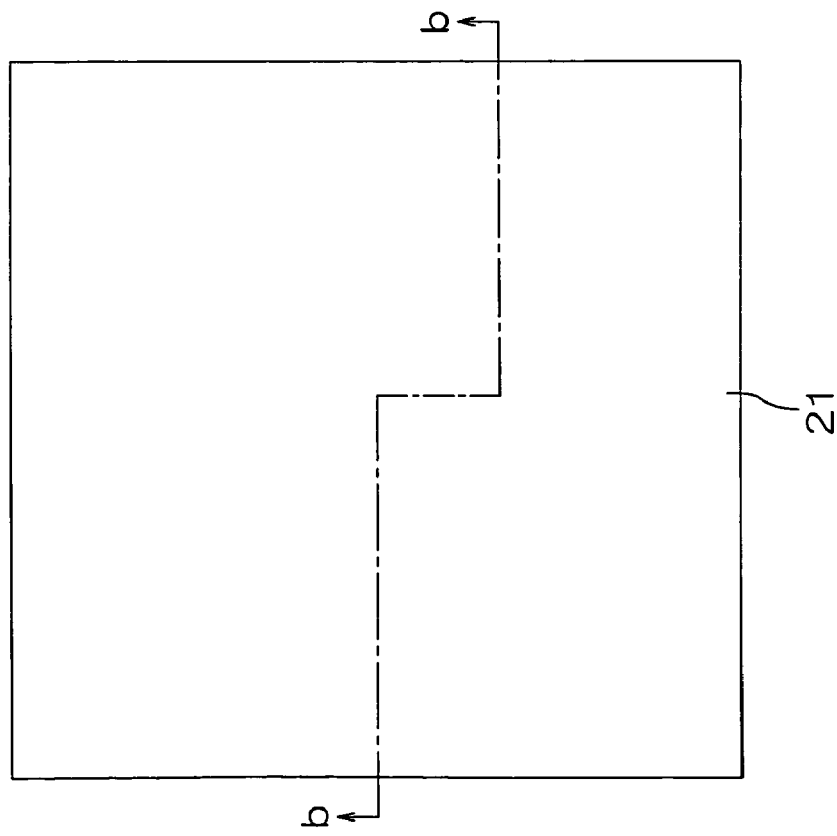
(b) 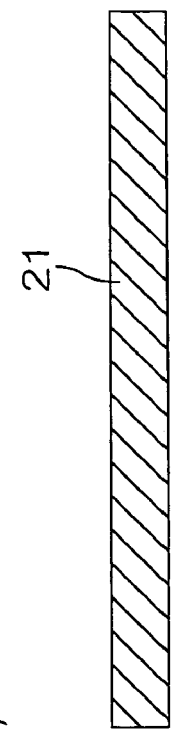

FIG. 3
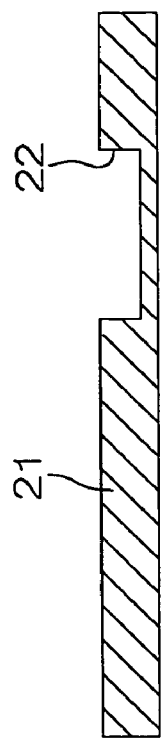
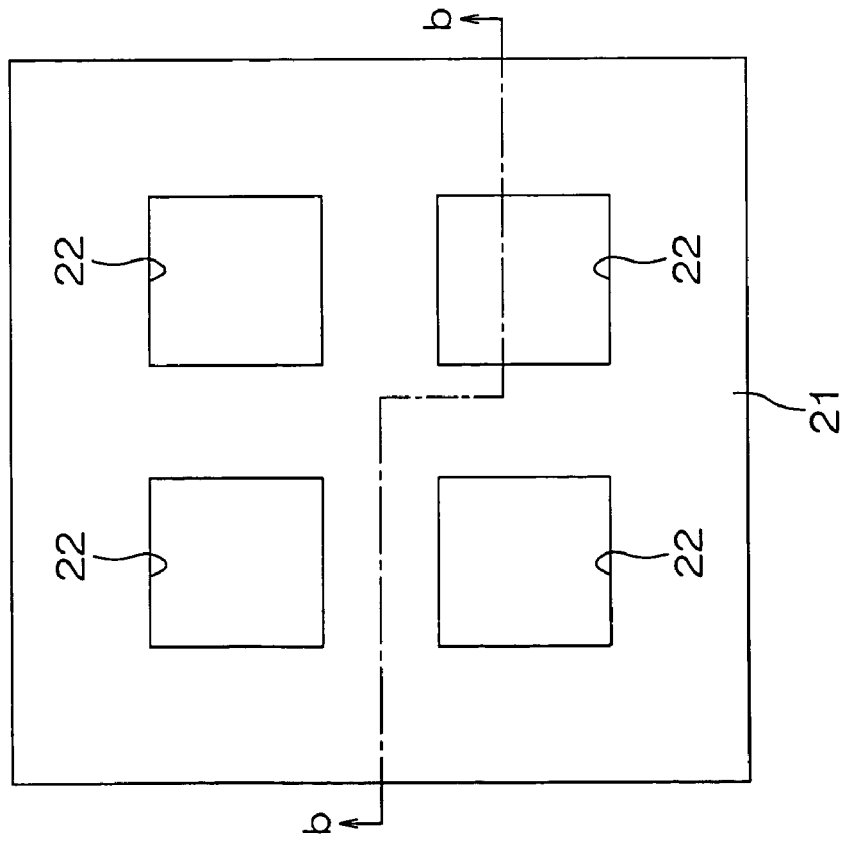

FIG. 4
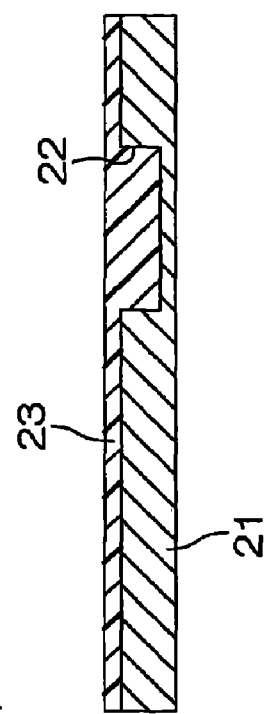
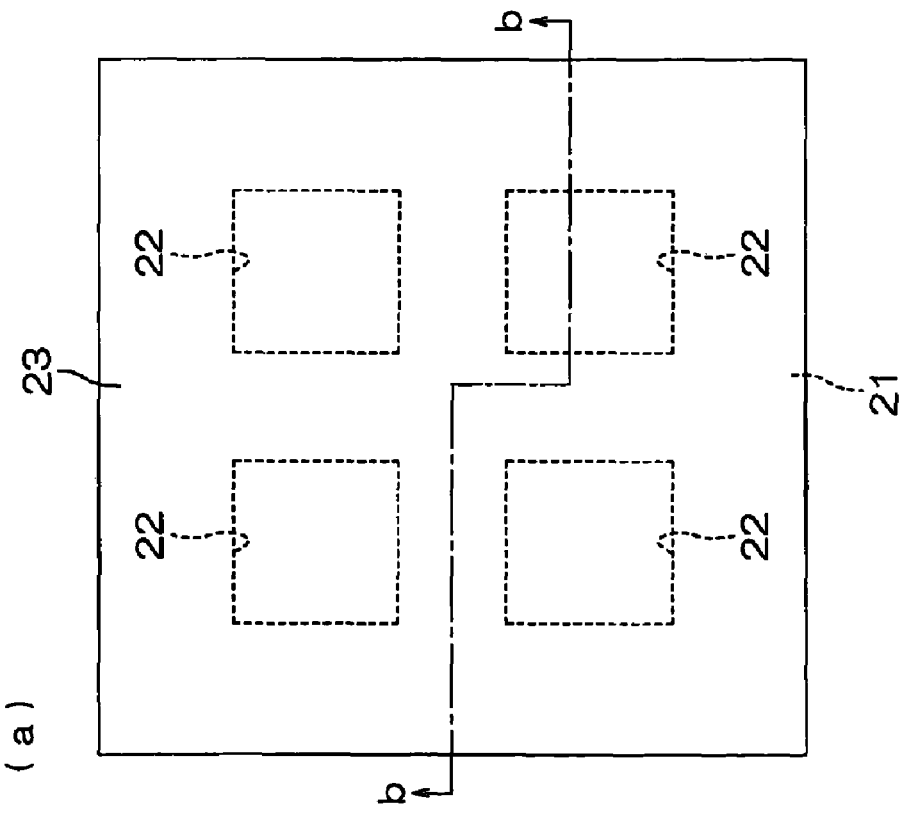

ACCELERATION SENSOR AND METHOD OF MANUFACTURING ACCELERATION SENSOR

BACKGROUND OF THE INVENTION

1. Field of the Invention

The present invention relates to an acceleration sensor and a method of manufacturing the same.

2. Description of Related Art

A sensor to which an MEMS (Micro Electro Mechanical Systems) technique is applied has been recently loaded on a portable telephone, and hence an MEMS sensor is increasingly watched with interest. For example, an acceleration sensor for detecting the acceleration of a substance is known as a typical MEMS sensor.

FIG. 13 is a schematic perspective view of a conventional acceleration sensor.

An acceleration sensor 101 is a piezoresistive sensor detecting acceleration with piezoresistive elements, and includes a sensor chip 102 and glass chips 103 and 109 for sealing (device-sealing) the sensor chip 102.

The sensor chip 102 includes a frame 104, a weight 105 and four beams 106.

The frame 104 is in the form of a quadrangular ring (a frame) in plan view.

The weight 105 is arranged on a region surrounded by the frame 104 at an interval from the frame 104. The weight 105 is formed by a central columnar portion 107 in the form of a quadrangular column and four peripheral columnar portions 108 in the form of quadrangular columns provided on the periphery of the central columnar portion 107. Each of the central columnar portion 107 and the peripheral columnar portions 108 has a thickness (height) identical to that of the frame 104. The central columnar portion 107 is arranged on a central portion of the region surrounded by the frame 104, so that the outer peripheral edges thereof are parallel to the inner peripheral edges (the inner surfaces) of the frame 104 in plan view. The peripheral columnar portions 108 are arranged one by one on extensions of diagonal lines on the upper surface of the central columnar portion 107. Single corners of the side surfaces of the peripheral columnar portions 108 are connected to the corners of the side surfaces of the central columnar portion 107 respectively. Thus, the central columnar portion 107 and the four peripheral columnar portions 108 integrally constitute the weight 105 having the same thickness as the frame 104.

Each beam 106 extends between each pair of peripheral columnar portions 108 adjacent to each other, parallelly to the side surfaces of the peripheral columnar portions 108 at intervals. An end of the beam 106 is connected to the frame 104, while another end thereof is connected to the central columnar portion 107. The beam 106 has a thickness of about 7 μm, for example, to be deformable and deflectable due to the thickness. Thus, the four beams 106 support the weight 105 to be vibratile on the frame 104.

The glass chip 103 is in the form of a quadrangular plate having outer peripheral edges generally identical in shape to the outer peripheral edges (the outer surfaces) of the frame 104 in plan view. The glass chip 103 is made of heat-resistant glass such as Pyrex (registered trademark), for example, and anodically bonded to the lower surface of the sensor chip 102.

The glass chip 109 is also in the form of a quadrangular plate having outer peripheral edges generally identical in shape to the outer peripheral edges (the outer surfaces) of the frame 104 in plan view. The glass chip 109 is made of heat-resistant glass such as Pyrex (registered trademark), for example, and bonded to the upper surface of the sensor chip 102.

A plurality of piezoresistive elements (not shown) are arranged on the four beams 106.

When acceleration acts on the acceleration sensor 101 and the weight 105 vibrates, the beams 106 are distorted. Due to the distortion of the beams 106, stress acts on the piezoresistive elements provided on the beams 106, to change the resistivity of the piezoresistive elements. When the change of the resistivity of each piezoresistive element is extracted as a signal, therefore, the physical quantity (acceleration) acting on the acceleration sensor 101 (the weight 105) can be detected on the basis of the signal.

In the acceleration sensor 101, the glass chips 103 and 109 are bonded to the sensor chip 102, thereby sealing (device-sealing) the sensor chip 102. A space for holding the weight 105 in a vibratile manner is formed due to the device sealing.

In order to bond the sensor chip 102 and the glass chips 103 and 109 to one another, the sensor chip 102 and the glass chip 103 are first anodically bonded to each other.

In order to anodically bond the sensor chip 102 and the glass chip 103 to each other, the sensor chip 102 is aligned with each of glass chips 103 arrayed on a wafer-type glass substrate. In this case, the outer peripheral edges of the sensor chip 102 are aligned with alignment marks formed on the glass chip 103 while the position of the sensor chip 102 with respect to the alignment marks is confirmed (visually recognized) through the glass chip 103. Then, the lower surface 104 of the frame 104 of the sensor chip 102 and one surface of the glass chip 103 are approximated to each other, and a high voltage is applied therebetween. Charge is formed in the vicinity of the lower surface of the frame 104 and the surface of the glass chip 103 due to the application of the high voltage, and an electric double layer is formed through the interface therebetween. Thus, the sensor chip 102 and the glass chip 103 are anodically bonded to each other.

After the sensor chip 102 and the glass chip 103 are bonded to each other, the glass chip 109 is aligned with the glass chip 103 while the alignment marks are confirmed (visually recognized) from the side of the other surface of the glass chip 103 through the glass chip 103, and bonded to the sensor chip 102.

On the other hand, there is a demand for substituting low-priced silicon chips for the glass chips 103 and 109 as the chips for device-sealing the sensor chip 102. However, the silicon chips are not excellent in transparency, dissimilarly to the glass chips. When the lower silicon chip is bonded to the lower surface of the sensor chip 102 by aligning the outer peripheral edges of the sensor chip 102 with alignment marks formed on the silicon chip, therefore, the alignment marks cannot be visually recognized from above and from under the silicon chip. Therefore, it is difficult to align the upper silicon chip with the lower silicon chip, and the positioning accuracy of the upper silicon chip with respect to the lower silicon chip is disadvantageously reduced.

SUMMARY OF THE INVENTION

An object of the present invention is to provide an acceleration sensor and a method of manufacturing the same, in which a silicon chip can be bonded to one side of a sensor chip in high accuracy and a sealing chip bonded to the other side of the sensor chip can be aligned with the bonded silicon chip in high accuracy.

The foregoing and other objects, features and effects of the present invention will become more apparent from the following detailed description of the embodiments with reference to the attached drawings.

BRIEF DESCRIPTION OF THE DRAWINGS

FIGS. 2(a) to 7(b) are schematic diagrams for illustrating a method of preparing a sensor chip shown in FIGS. 1(a) and 1(b) in step order.

FIGS. 9 to 12(b) are schematic diagrams for illustrating a method of bonding silicon chips and a sensor chip to one another in step order.

DETAILED DESCRIPTION OF PREFERRED EMBODIMENTS

Figure 1:
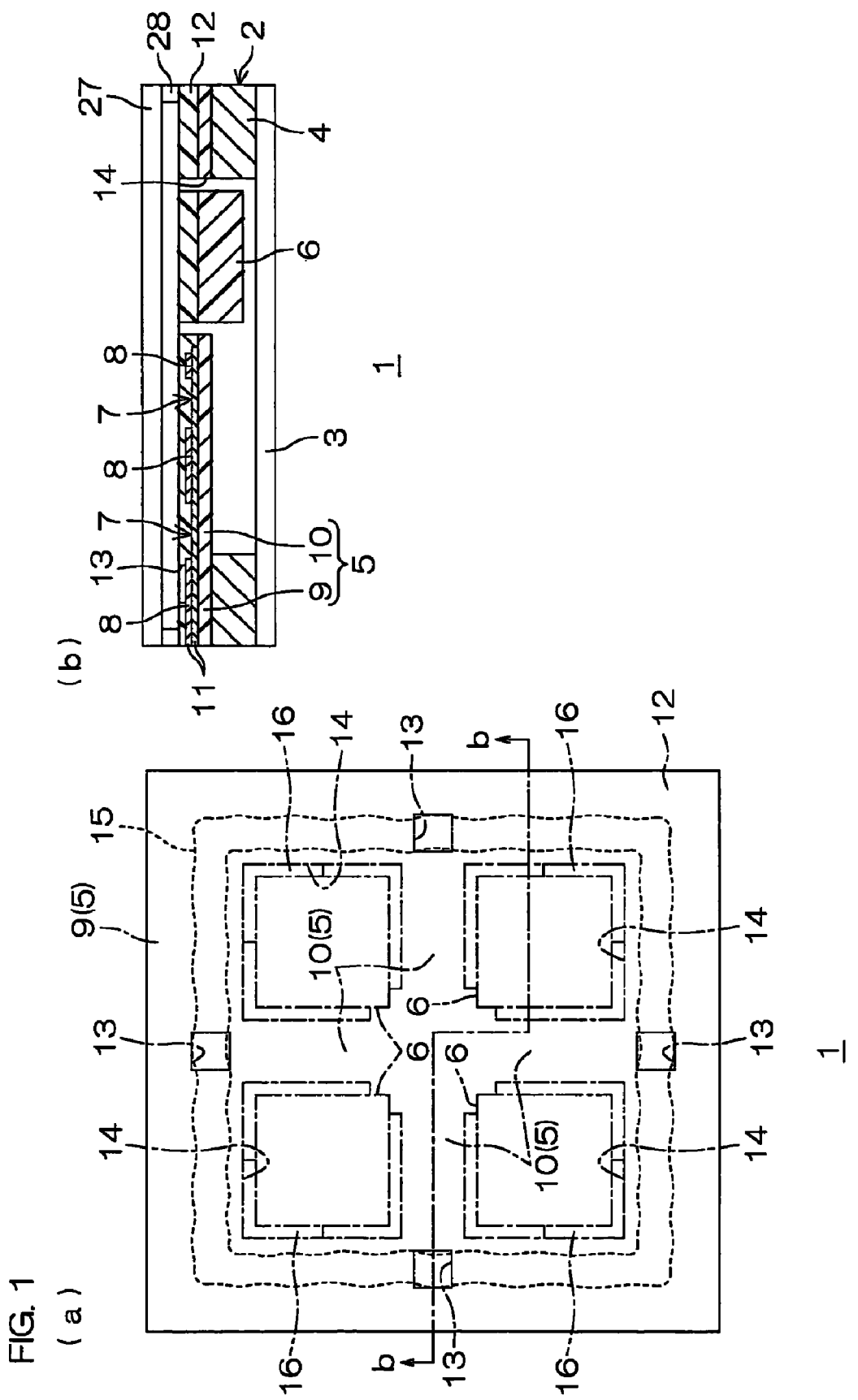
FIGS. 1(a) and 1(b) are a schematic plan view and a schematic sectional view of an acceleration sensor according to an embodiment of the present invention respectively.

An acceleration sensor according to an embodiment of the present invention includes a sensor chip having a movable portion operating in response to a change in a physical quantity and a silicon chip arranged to be opposed to a first side of the sensor chip and bonded to the sensor chip, while the sensor chip is provided with a penetrating portion penetrating the sensor chip in the thickness direction so that the first side is visually recognizable from a second side of the sensor chip, and the silicon chip is provided with an alignment mark on a portion opposed to the penetrating portion.

According to the structure, the sensor chip is provided with the penetrating portion penetrating the sensor chip in the thickness direction so that the first side is visually recognizable from the second side thereof. The silicon chip is provided with the alignment mark on the portion opposed to the penetrating portion.

Therefore, the positioning accuracy for the silicon chip and the sensor chip can be improved by setting the relative position of the sensor chip with respect to the silicon chip to be aligned with the sensor chip so that the penetrating portion and the alignment mark are aligned with each other.

The alignment mark is visually recognizable through the penetrating portion, whereby a sealing chip for sealing the sensor chip can be aligned with the silicon chip in high accuracy when the sealing chip is bonded to the second side of the sensor chip.

Further, the chip for sealing the sensor chip is formed by a silicon chip, whereby the cost for the acceleration sensor can be reduced.

Preferably in the acceleration sensor, the alignment mark is prepared from an adhesive made of a photosensitive material.

According to the structure, a bonding agent for bonding the sensor chip and the silicon chip to each other and the alignment mark can be collectively prepared by patterning (exposing and developing, for example) the adhesive made of a photosensitive material. Therefore, the manufacturing efficiency for the acceleration sensor can be improved, and the manufacturing cost therefor can be reduced.

Preferably in the acceleration sensor, the sensor chip has a frame surrounding the movable portion and a deformable beam fitted in the frame for supporting the movable portion, and the penetrating portion includes a penetrating groove formed between the frame and the movable portion.

According to the structure, the deformable beam is fitted in the frame surrounding the movable portion. The beam supports the movable portion arranged between the same and the frame through the penetrating groove. In other words, the penetrating groove necessary for keeping movement of the movable portion is utilized as the penetrating portion. Therefore, no additional penetrating portion may be formed in the sensor chip so that the first side is visually recognizable from the second side of the sensor chip. Therefore, the structure of the acceleration sensor can be simplified.

Preferably in the acceleration sensor, the beam integrally includes a supporting portion in the form of a quadrangular ring in plan view supported by the frame and a beam body portion in the form of a cross in plan view supported by the supporting portion and has four rectangular openings partitioned by the supporting portion and the beam body portion, the movable portion is in the form of a quadrangular column, similar to the frame, having outer peripheral edges smaller than the inner peripheral edges of the frame while one of four corner portions formed by the side surfaces thereof is connected to a central portion of the beam body portion, the penetrating portion includes four penetrating grooves in the form of quadrangular rings closed on single corners in plan view formed between the side surfaces of the movable portion and the inner side surfaces of the frame, and four alignment marks in total are arranged on portions opposed to the four penetrating grooves respectively and visually recognized as hook-shaped in plan view through the penetrating grooves respectively.

According to the structure, the alignment marks are visually recognized not as points but as lines along the penetrating grooves in the form of quadrangular rings in plan view, whereby the relative position of the sensor chip with respect to the silicon chip can be confirmed through the alignment marks having wide areas. Consequently, the positioning accuracy for the silicon chip and the sensor chip can be further improved.

A method of manufacturing an acceleration sensor according to the embodiment of the present invention is a method of manufacturing an acceleration sensor by bonding a sensor chip having a movable portion operating in response to a change in a physical quantity and a silicon chip to each other, and includes the steps of forming an alignment mark for aligning the sensor chip on the silicon chip and bonding the silicon chip to a first side of the sensor chip while recognizing the alignment mark through a penetrating portion formed in the sensor chip to penetrate the sensor chip in the thickness direction.

According to the manufacturing method, the alignment mark for aligning the sensor chip is formed on the silicon chip. Then, the sensor chip and the silicon chip are bonded to each other while the alignment mark is recognized through the penetrating portion formed in the sensor chip to penetrate the same in the thickness direction.

Therefore, the sensor chip and the silicon chip can be bonded to each other in an aligned state (in a state aligned with each other in high accuracy) by forming the alignment mark for aligning the silicon chip and the sensor chip with each other in consideration of the pattern of the penetrating portion.

When the silicon chip and the sensor chip are bonded to each other so that the alignment mark is opposed to the penetrating portion, the alignment mark is visually recognizable through the penetrating portion after the silicon chip and the sensor chip are bonded to each other. Consequently, a sealing chip for sealing the sensor chip can be aligned with the silicon chip in high accuracy when the sealing chip is bonded to a second side of the sensor chip.

Further, the chip for sealing the sensor chip is formed by a silicon chip, whereby the cost for the acceleration sensor can be reduced.

Preferably, the method of manufacturing an acceleration sensor further includes a step of bonding a sealing chip made of silicon for sealing the sensor chip to a second side of the sensor chip while recognizing the alignment mark through the penetrating portion after bonding the silicon chip.

According to the method, the sensor chip and the sealing chip are bonded to each other while the alignment mark is recognized through the penetrating portion, whereby the sealing chip can be aligned with the silicon chip in high accuracy. Further, the sealing chip is made of silicon, whereby the cost for the acceleration sensor can be reduced.

Preferably in the method of manufacturing an acceleration sensor, the sensor chip has a frame surrounding the movable portion and a deformable beam fitted in the frame for supporting the movable portion, the beam integrally includes a supporting portion in the form of a quadrangular ring in plan view supported by the frame and a beam body portion in the form of a cross in plan view supported by the supporting portion and has four rectangular openings partitioned by the supporting portion and the beam body portion, the movable portion is in the form of a quadrangular column, similar to the frame, having outer peripheral edges smaller than the inner peripheral edges of the frame while one of four corner portions formed by the side surfaces thereof is connected to a central portion of the beam body portion, the penetrating portion includes four penetrating grooves in the form of quadrangular rings closed on single corners in plan view formed between the side surfaces of the movable portion and the inner side surfaces of the frame, and the alignment mark is shaped into a quadrangular ring in plan view in the step of forming the alignment mark, in consideration of the shapes of the four penetrating grooves.

According to the method, the alignment mark is shaped into a quadrangular ring in plan view, whereby patterning for forming the alignment mark can be easily performed.

The embodiment of the present invention is now described in more detail with reference to the attached drawings.

FIGS. 1(a) and 1(b) are a schematic plan view and a schematic sectional view (a sectional view taken along a line b-b in FIG. 1(a)) of the acceleration sensor according to the embodiment of the present invention respectively.

An acceleration sensor 1 is a piezoresistive sensor detecting acceleration with piezoresistive elements, and includes a sensor chip 2, a silicon chip 3 for sealing (device-sealing) a first side of the sensor chip 2 and another silicon chip 27 for sealing a second side of the sensor chip 2.

The sensor chip 2 includes a frame 4, a beam 5, weights 6, resistive conductors 7 and wires 8.

The frame 4 is made of SiN (silicon nitride). The frame 4 is in the form of a quadrangular ring (a frame) in plan view, and has a thickness of 1 to 10 µm.

The beam 5 and the weights 6 are made of an organic material (polyimide, for example), and integrally formed.

The beam 5 integrally includes a supporting portion 9 in the form of a quadrangular ring in plan view supported by the frame 4 and a beam body portion 10 in the form of a cross in plan view supported by the supporting portion 9. The forward ends of the beam body portion 10 are connected to the centers of the sides of the supporting portion 9 respectively. Thus, the beam 5 is fitted in the frame 4, and has four rectangular openings partitioned by the supporting portion 9 and the beam body portion 10. The beam 5 has a thickness of 1 to 10 µm, so that the beam body portion 10 is deformable and deflectable due to the thickness.

Each weight 6 is arranged in each opening of the beam 5. The weight 6, having an upper surface flush with the upper surface of the beam 5, has a thickness (height) of 1 to 10 µm. The weight 6 is in the form of a generally quadrangular column, similar to the frame 4, having outer peripheral edges (outer surfaces) smaller than the inner peripheral edges (the inner surfaces) of the frame 4 in plan view. Therefore, the side surfaces of the weight 6 are parallel to the inner side surfaces of the frame 4 with clearances. Thus, a penetrating groove 14 in the form of a quadrangular ring closed on one corner in plan view is formed between the side surfaces of each weight 6 and the inner side surfaces of the frame 4 to penetrate the sensor chip 2 in the thickness direction. One of four corner portions formed by the side surfaces of the weight 6 is connected to the central portion of the beam body portion 10 of the beam 5. Thus, the weight 6 is supported by the beam 5 (the beam body portion 10) in a state not in contact with the frame 4.

A laminate 11 of a Ti (titanium) layer, a TiN (titanium nitride) layer and an Al (aluminum)-Cu (copper) alloy layer is stacked on the beam 5. The laminate 11 has end portions arranged on the supporting portion 9, extends along the beam body portion 10, and is in the form of a cross in plan view as a whole. The lowermost Ti layer and the TiN layer provided thereon are continuously formed. On the other hand, the uppermost Al—Cu alloy layer is broken on twelve portions, for example, to be intermittently formed. Thus, the Ti layer and the TiN layer are partially exposed on the broken portions (removed portions) of the Al—Cu alloy layer so that the exposed portions form the resistive conductors 7, while the Al—Cu alloy forms the wires 8 connected to the resistive conductors 7.

The outermost surface of the acceleration sensor 1 is covered with a protective film 12 made of polyimide, for example. Pad openings 13 are formed in the protective film 12, for exposing the end portions of the wires 8 formed along the cross in plan view as pads for external connection.

Further, openings communicating with the penetrating grooves 14 are formed in the protective film 12. Thus, the space between the upper side (the second side) and the lower side (the first side) of the sensor chip 2 is visually recognizable through the penetrating grooves 14.

The silicon chip 3 is in the form of a quadrangular plate in plan view having outer peripheral edges generally identical in shape to the outer peripheral edges (the outer surfaces) of the frame 4 of the sensor chip 2, and has a thickness of about 1 to 10 µm.

The silicon chip 3 and the sensor chip 2 are bonded to each other by a bonding agent 15 interposed therebetween (more specifically, between the upper surface (the second surface) of the silicon chip 3 and the lower surface of the frame 4).

The bonding agent 15 is prepared from an adhesive made of a photosensitive material (polyimide, for example), such as a photosensitive die-bonding agent or a photosensitive die-bonding tape, for example.

Alignment marks 16 are formed on the upper surface of the silicon chip 3. The alignment marks 16 are prepared from an adhesive made of a photosensitive material, similarly to the bonding agent 15. Four such alignment marks 16 in total are arranged on portions opposed to the four penetrating grooves 14 of the sensor chip 2 respectively. Each alignment mark 16 is visually recognized as hook-shaped (L-shaped) in plan view through each penetrating groove 14.

The silicon chip 27 is in the form of a quadrangular plate in plan view having outer peripheral edges generally identical in shape to the outer peripheral edges (the outer surfaces) of the frame 4 of the sensor chip 2, and has a thickness of 1 to 10 μm.

The silicon chip 27 and the sensor chip 2 are bonded to each other by a spacer 28 and a bonding agent (not shown) interposed therebetween.

The acceleration sensor 1 is provided with a space partitioned by the silicon chip 27, the frame 4 and the silicon chip 3 for holding the weights 6 in a vibratile manner.

When acceleration acts on the acceleration sensor 1 and the weights 6 vibrate, the beam body portion 10 of the beam 5 is distorted (twisted and/or deflected). The resistive conductors 7 provided on the beam body portion 10 are expanded/contracted due to the distortion of the beam body portion 10, to change the resistance values thereof. The changes of the resistance values are extracted as signals through the pads, so that the directions (the triaxial directions) and the magnitudes of the acceleration acting on the weights 6 (the acceleration sensor 1) can be detected on the basis of the signals.

In order to manufacture the aforementioned acceleration sensor 1, the sensor chip 2 is first prepared, for example.

FIGS. 2(a) to 7(b) are schematic diagrams for illustrating the method of preparing the sensor chip 2 shown in FIG. 1 in step order. FIGS. 2(a), 3(a), 4(a) and 7(a) are plan views of the sensor chip 2, and FIGS. 2(b), 3(b), 4(b) and 7(b) are sectional views taken along lines b-b in FIGS. 2(a), 3(a), 4(a) and 7(a) respectively.

In order to prepare the sensor chip 2, an SiN layer 21 as an underlayer made of the material for the frame 4 is formed, as shown in FIGS. 2(a) and 2(b).

Then, a resist film having openings in portions corresponding to those for forming the weights 6 respectively is formed on the SiN layer 21. Then, the SiN layer 21 is etched by RIE (Reactive Ion Etching) through the resist mask. Consequently, four recesses 22 are formed in the surface of the SiN layer 21, as shown in FIGS. 3(a) and 3(b).

Thereafter the organic material (polyimide, for example) for the beam 5 and the weights 6 is applied to the overall region of the upper surface of the SiN layer 21 having the recesses 22 thereby forming an organic material layer 23 made of the organic material, as shown in FIGS. 4(a) and 4(b). The organic material 23 fills up the recesses 22, covers the overall region of the surface of the SiN layer 21, and has a generally planar surface.

Figure 5:
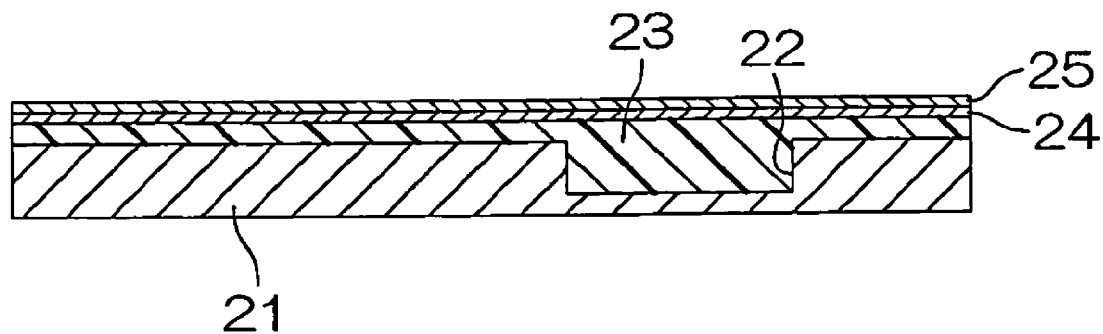

Then, a Ti layer/TiN layer 24 and an Al—Cu alloy layer 25 are formed on the organic material layer 23 in this order by sputtering, as shown in FIG. 5.

Figure 6:
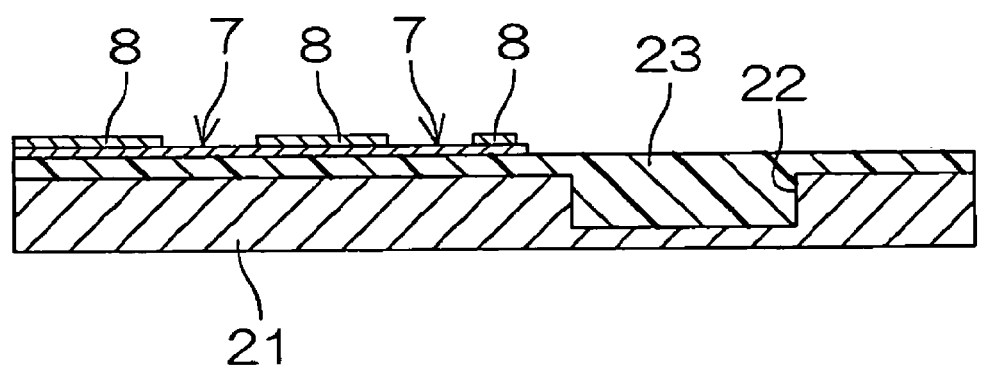
Figure 7:
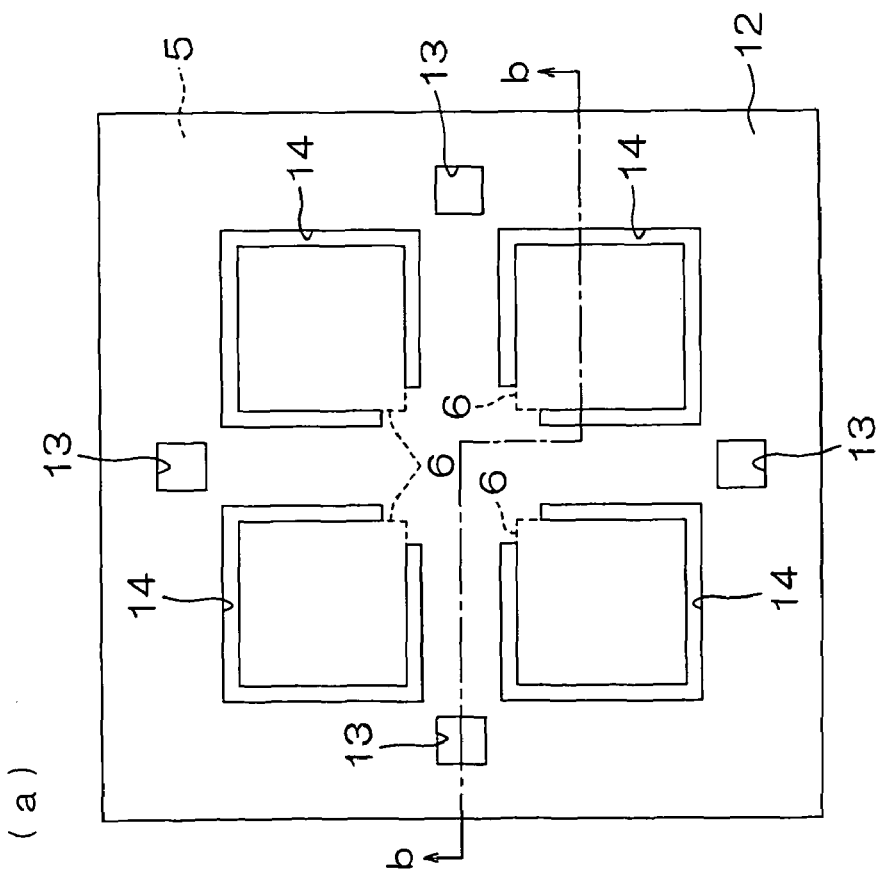

Thereafter the resistive conductors 7 and the wires 8 are formed by patterning the Ti layer/TiN layer 24 and the Al—Cu alloy layer 25, as shown in FIG. 6.

Then, the material for the protective film 12 is applied onto the organic material layer 23 provided with the resistive conductors 7 and the wires 8, as shown in FIGS. 7(a) and 7(b). Then, the pad openings 13 are formed by partially removing a layer made of the material for the protective film 12. Further, the penetrating grooves 14 corresponding to clearances between the beam 5 and the weights 6 are formed to be along the outer peripheries of the recesses 22 in plan view respectively by partially removing the layer made of the material for the protective film 12 and the organic material layer 23. Thus, the organic material layer 23 forms the beam 5 and the weights 6. The penetrating grooves 14 are so formed that the surface of the SiN layer 21 is partially exposed through the penetrating grooves 14.

Thereafter portions of the SiN layer 21 located under the beam 5 and the weights 6 are removed through the penetrating grooves 14 by CDE (Chemical Dry Etching) from the side of the protective film 12. The CDE is continued until the portions of the SiN layer 21 located under the weights 6 are entirely removed. As a result of the CDE, the SiN layer 21 is patterned into the frame 4, and the sensor chip 2 having the structure shown in FIG. 1 is obtained.

While the sensor chip 2 is prepared, a silicon wafer 17 provided with silicon chips 3 is prepared.

Figure 8:
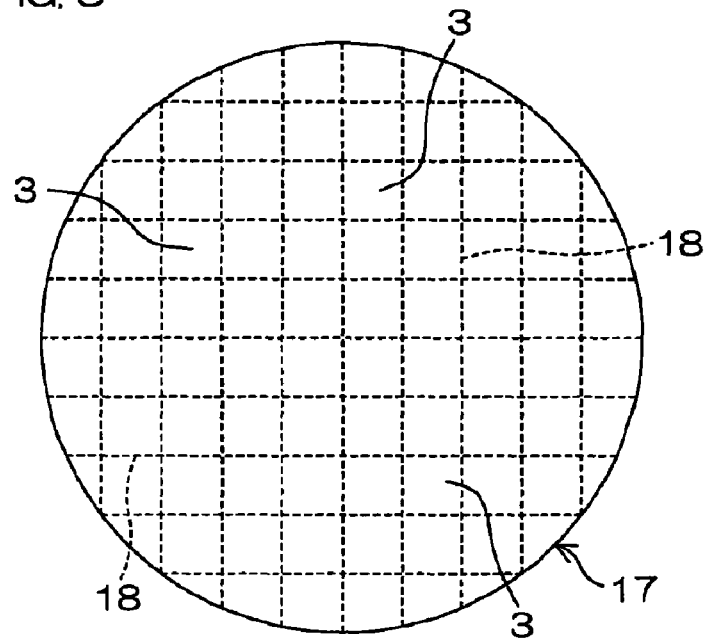
FIG. 8 is a schematic plan view of a silicon wafer employed in a method of manufacturing the acceleration sensor shown in FIGS. 1(a) and 1(b).

FIG. 8 is a schematic plan view of the silicon wafer 17 employed for manufacturing the acceleration sensor 1 shown in FIG. 1.

A plurality of silicon chips 3 are provided on the silicon wafer 17, to be integrally arrayed in the form of a lattice. Dicing lines 18 for dicing the silicon wafer 17 are formed on the silicon wafer 17 along the boundaries between adjacent ones of the silicon chips 3.

The acceleration sensor 1 shown in FIG. 1 is manufactured by bonding the sensor chip 2 obtained in the above to each silicon chip 3 of the silicon wafer 17.

FIGS. 9 to 12(b) are schematic diagrams for illustrating a method of bonding the sensor chip 2 and the silicon chips 3 and 27 to one another in step order.

Figure 9:
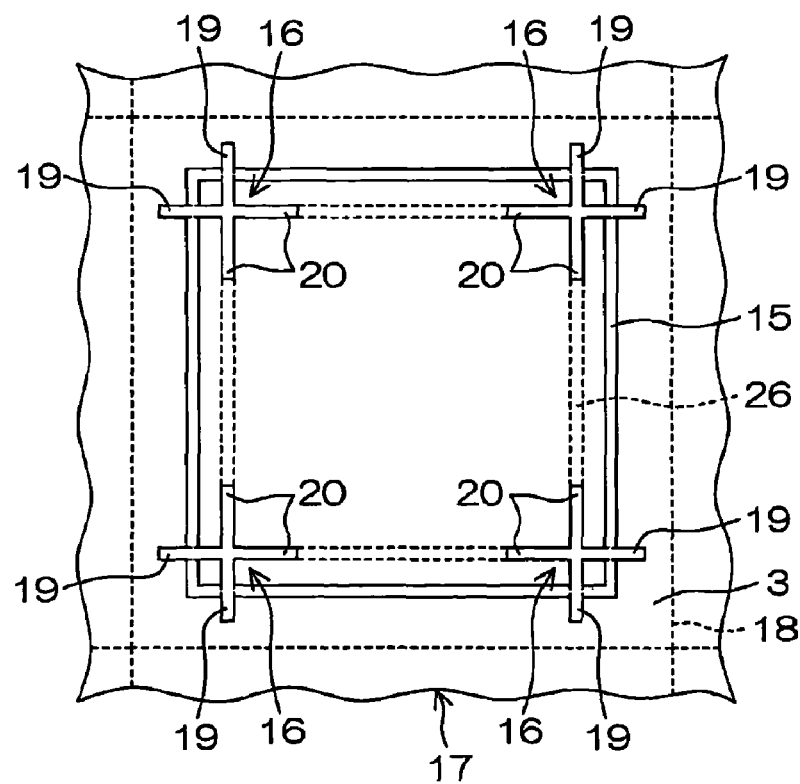

In order to bond the sensor chip 2 and the silicon chip 3 to each other, the material (the adhesive) for the bonding agent 15 is first applied onto the silicon wafer 17. Then, the applied bonding agent is patterned (exposed and developed) by a well-known patterning technique, as shown in FIG. 9. Thus, the bonding agent 15 and the alignment marks 16 are simultaneously formed on each silicon chip 3 in prescribed patterns.

The bonding agent 15 is patterned into a quadrangular ring in plan view, similar to the frame 4 of the sensor chip 2, smaller than the outer peripheral edges (the outer surfaces) of the frame 4 and larger than the inner peripheral edges (the inner surfaces) of the frame 4.

The alignment marks 16 are patterned in consideration of the patterns of the penetrating grooves 14 of the sensor chip 2 in plan view. More specifically, four alignment marks 16 in total are formed to be cross-shaped in plan view, correspondingly to the corners of the bonding agent 15 respectively. Each alignment mark 16 is so patterned that the center thereof is positioned slightly inward from each corner of the bonding agent 15 in the diagonal direction, a pair of sides (a pair of outer sides 19) extending outward from the center are orthogonal to the bonding agent 15 and another pair of sides (a pair of inner sides 20) extending inward are parallel to the bonding agent 15 respectively.

The alignment marks 16 are so formed as a whole that a virtual pattern 26 in the form of a quadrangular ring in plan view with corner portions defined by the pairs of inner sides 20 has a pattern, similar to that of the frame 4, slightly smaller than the inner peripheral edges (the inner surfaces) of the frame 4. In other words, the alignment marks 16 are so patterned that the virtual pattern 26 is aligned with each penetrating groove 14, in consideration of the penetrating groove 14 in the form of a quadrangular ring closed on one corner in plan view, formed between the side surfaces of each weight 6 and the inner side surfaces of the frame 4.

Figure 10:
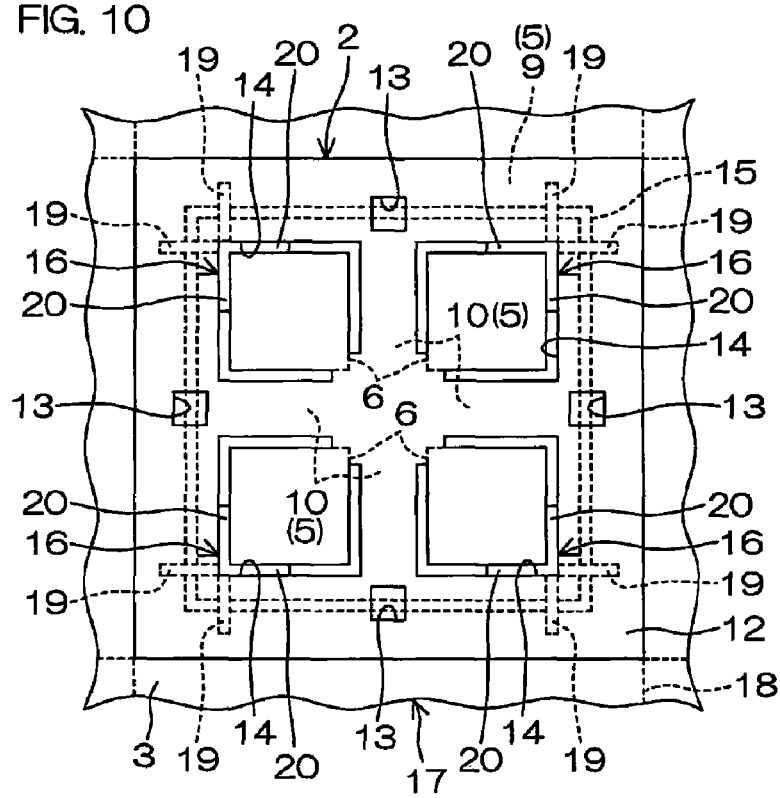

After the formation of the bonding agent 15 and the alignment marks 16, the sensor chip 2 is aligned with the silicon chip 3, as shown in FIG. 10. In order to align the sensor chip 2 with the silicon chip 3, the sensor chip 2 is first moved to a position above the silicon chip 3. Then, the pairs of inner sides 20 of the alignment marks 16 are aligned with all of the four penetrating grooves 14 while the positions of the alignment marks 16 visually recognized through the penetrating grooves 14 are confirmed by visually recognizing the lower side from the upper side of the sensor chip 2 through the penetrating grooves 14.

Figure 11:
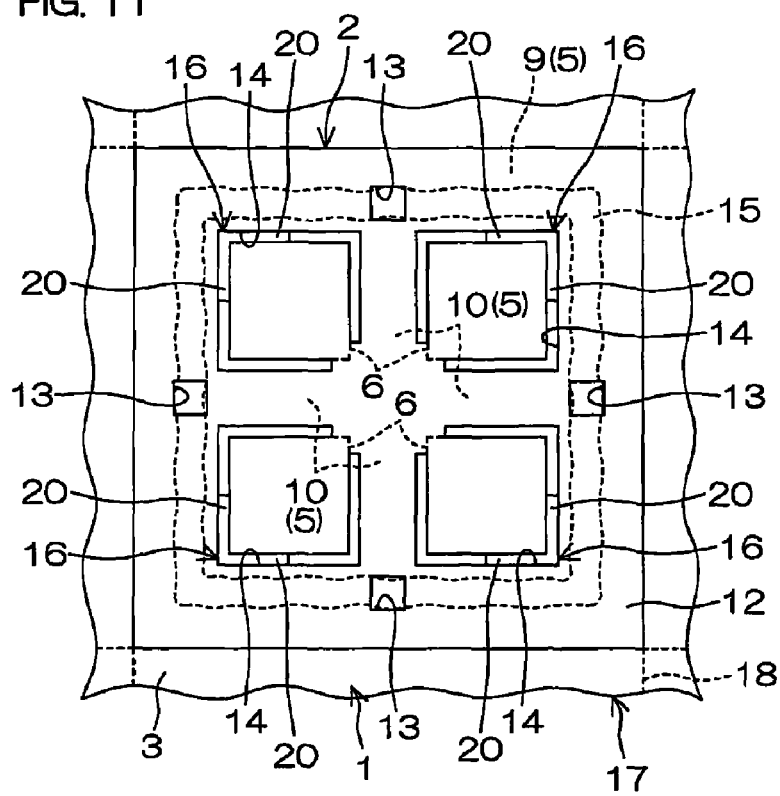
Figure 12:
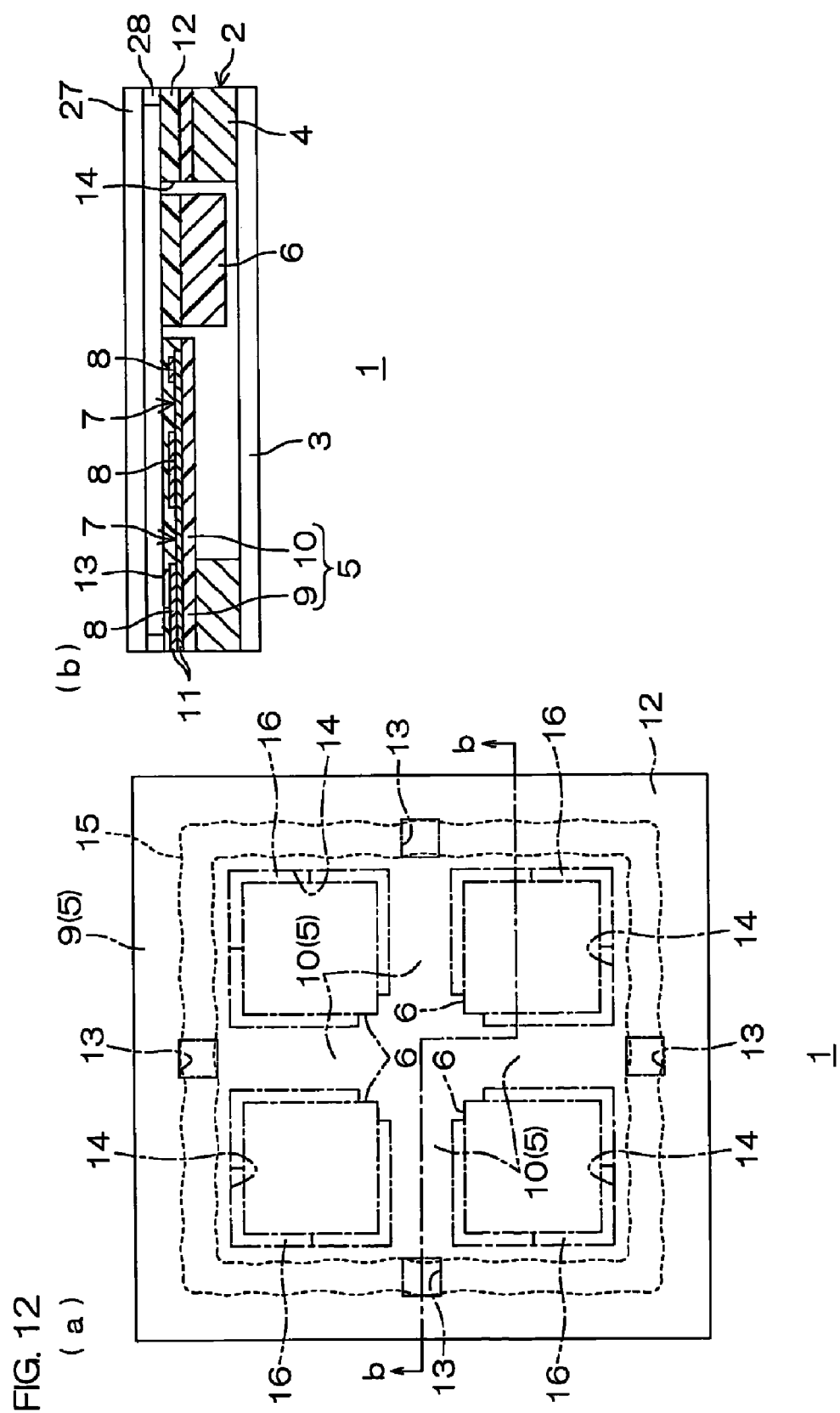
Figure 13:
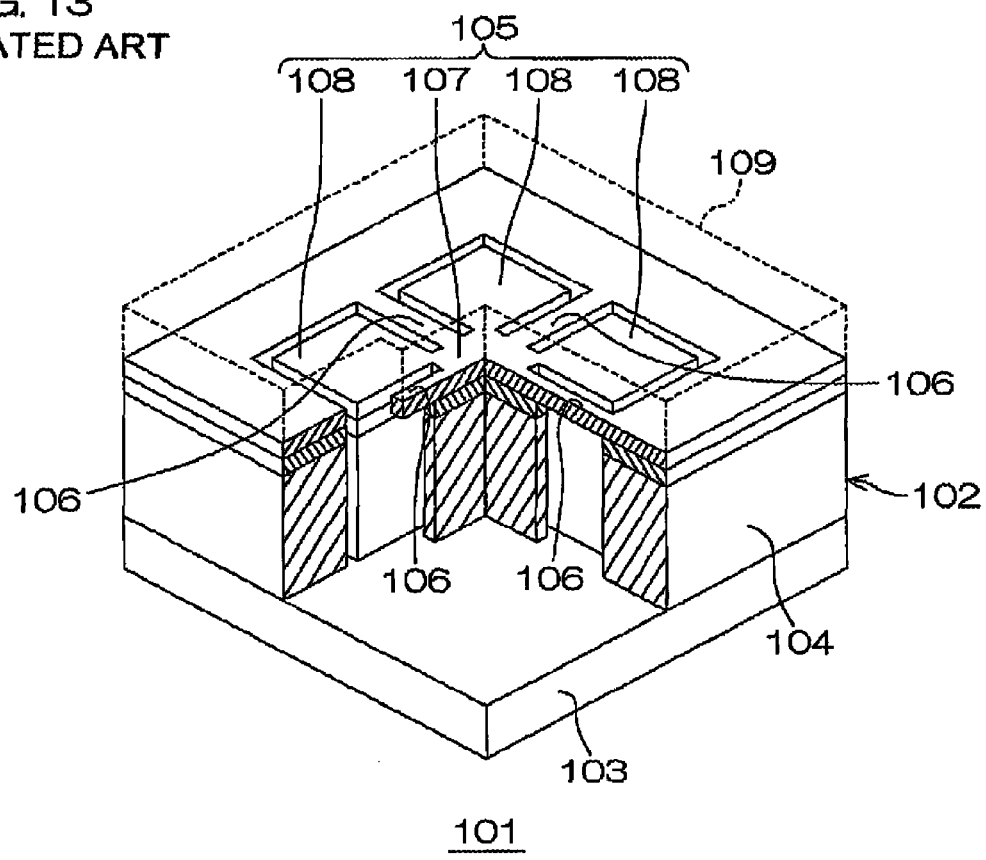
FIG. 13 is a schematic perspective view of a conventional acceleration sensor.

After the alignment between the penetrating grooves 14 and the pairs of inner sides 20 of the alignment marks 16, the sensor chip 2 is pressed against the silicon chip 3 so that parts (the pairs of outer sides 19, for example) of the alignment marks 16 and the bonding agent 15 are crushed, and the sensor chip 2 and the silicon chip 3 are bonded to each other, as shown in FIG. 11.

Then, the silicon chip 27 is aligned with the silicon chip 3 and bonded to the upper surface of the sensor chip 2 through the spacer 28 while the alignment marks 16 are confirmed through the penetrating grooves 14, as shown in FIGS. 12(a) and 12(b).

Thereafter the acceleration sensor 1 shown in FIG. 1 is obtained by dicing (dividing) the silicon wafer 17 into each device.

In the acceleration sensor 1, as hereinabove described, the penetrating groove 14 in the form of a quadrangular ring closed on one corner in plan view penetrating the sensor chip 2 in the thickness direction is formed between the side surfaces of each weight 6 and the inner side surfaces of the frame 4. Thus, the space between the upper side (the second side) and the lower side (the first side) of the sensor chip 2 is visually recognizable through the penetrating groove 14.

In order to manufacture the acceleration sensor 1, the alignment marks 16 are formed on each silicon chip 3 provided on the silicon wafer 17 in consideration of the pattern of the penetrating groove 14 of the sensor chip 2. More specifically, the alignment marks 16 are so patterned that the virtual pattern 26 in the form of a quadrangular ring in plan view is aligned with the penetrating groove 14 in the form of a quadrangular ring closed on one corner in plan view (see FIGS. 9(a) and 9(b)).

When the sensor chip 2 and the silicon chip 3 are bonded to each other, therefore, the pairs of inner sides 20 of the alignment marks 16 can be aligned with all of the four penetrating grooves 14 by confirming the positions of the alignment marks 16 visually recognized through the penetrating grooves 14. Thus, the silicon chip 3 and the sensor chip 2 can be aligned with each other. Consequently, the silicon chip 3 and the sensor chip 2 can be bonded to each other in an aligned state (in a state aligned with each other in high accuracy) by pressing the sensor chip 2 against the silicon chip 3 in the aligned state.

After the sensor chip 2 and the silicon chip 3 are bonded to each other, the positions of the alignment marks 16 can be confirmed through the penetrating grooves 14, whereby the silicon chip 27 can be aligned with the silicon chip 3 in high accuracy when the same is bonded to the sensor chip 2.

The chips for sealing the sensor chip 2 are formed by the silicon chips 3 and 27, whereby the cost for the acceleration sensor 1 can be reduced.

Both of the bonding agent 15 and the alignment marks 16 are prepared from the adhesive made of a photosensitive material, whereby the bonding agent 15 and the alignment marks 16 can be collectively prepared by patterning the adhesive applied to the silicon wafer 17. Therefore, the manufacturing efficiency for the acceleration sensor 1 can be improved, and the manufacturing cost therefor can be reduced.

The penetration grooves 14 formed between the frame 4 and the weights 6 are portions necessary for keeping the weights 6 movable. Thus, the portions essential for keeping the weights 6 of the acceleration sensor 1 vibratile are utilized as penetration portions for recognizing the alignment marks 16. Therefore, no additional penetrating portions may be formed in the sensor chip 2 so that the lower side (the first side) of the sensor chip 2 is visually recognizable from the upper side (the second side). Therefore, the structure of the acceleration sensor 1 can be simplified.

While the embodiment of the present invention has been described, the present invention may be embodied in other ways.

For example, the alignment marks 16 may be made of a material other than the adhesive employed for the bonding agent 15, so far as the same can be aligned with the penetrating grooves 14.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-239553 filed with the Japan Patent Office on Sep. 18, 2008, the disclosure of which is incorporated herein by reference.

What is claimed is:

1. An acceleration sensor comprising:
a sensor chip having a movable portion operating in response to a change in a physical quantity; and
a silicon chip arranged to be opposed to a first side of the sensor chip and bonded to the sensor chip, wherein
the sensor chip is provided with a penetrating portion penetrating the sensor chip in a thickness direction so that the first side is visually recognizable from a second side of the sensor chip, and
the silicon chip is provided with an alignment mark on a portion opposed to the penetrating portion, wherein the alignment mark is visually recognizable through the penetration portion from the second side of the sensor chip.

2. The acceleration sensor according to claim 1, wherein the alignment mark is prepared from an adhesive made of a photosensitive material.

3. The acceleration sensor according to claim 1, wherein the sensor chip has a frame surrounding the movable portion and a deformable beam fitted in the frame for supporting the movable portion, and
the penetrating portion includes a penetrating groove formed between the frame and the movable portion.

4. The acceleration sensor according to claim 3, wherein the beam integrally includes a supporting portion in the form of a quadrangular ring in plan view supported by the frame and a beam body portion in the form of a cross in plan view supported by the supporting portion, and has four rectangular openings partitioned by the supporting portion and the beam body portion,
the movable portion is in the form of a quadrangular column, similar to the frame, having outer peripheral edges smaller than inner peripheral edges of the frame, while one of four corner portions formed by side surfaces thereof is connected to a central portion of the beam body portion,
the penetrating portion includes four penetrating grooves in the form of quadrangular rings closed on single corners in plan view formed between the side surfaces of the movable portion and inner side surfaces of the frame, and
four alignment marks in total are arranged on portions opposed to the four penetrating grooves respectively, and visually recognized as hook-shaped in plan view through the penetrating grooves respectively.

5. A method of manufacturing an acceleration sensor by bonding a sensor chip having a movable portion operating in response to a change in a physical quantity and a silicon chip to each other, comprising the steps of:

forming an alignment mark for aligning the sensor chip on the silicon chip; and bonding the silicon chip to a first side of the sensor chip while visually recognizing the alignment mark from a second side of the sensor chip through a penetrating portion formed in the sensor chip to penetrate the sensor chip in a thickness direction.

6. The method of manufacturing an acceleration sensor according to claim 5, further comprising a step of bonding a sealing chip made of silicon for sealing the sensor chip to a second side of the sensor chip while recognizing the alignment mark through the penetrating portion after bonding the silicon chip.

7. The method of manufacturing an acceleration sensor according to claim 5, wherein the sensor chip has a frame surrounding the movable portion and a deformable beam fitted in the frame for supporting the movable portion, the beam integrally includes a supporting portion in the form of a quadrangular ring in plan view supported by the frame and a beam body portion in the form of a cross in plan view supported by the supporting portion, and has four rectangular openings partitioned by the supporting portion and the beam body portion, the movable portion is in the form of a quadrangular column, similar to the frame, having outer peripheral edges smaller than inner peripheral edges of the frame, while one of four corner portions formed by side surfaces thereof is connected to a central portion of the beam body portion, the penetrating portion includes four penetrating grooves in the form of quadrangular rings closed on single corners in plan view formed between the side surfaces of the movable portion and inner side surfaces of the frame, and the alignment mark is shaped into a quadrangular ring in plan view in the step of forming the alignment mark, in consideration of the shapes of the four penetrating grooves.

8. The acceleration sensor according to claim 1, further including a piezoresistive sensor detecting acceleration with piezoresistive elements.

9. The acceleration sensor according to claim 3, wherein the frame is made of SiN.

10. The acceleration sensor according to claim 3, wherein the frame is in the form of a quadrangular ring in plan view.

11. The acceleration sensor according to claim 3, wherein the beam is made of an organic material.

12. The acceleration sensor according to claim 3, wherein a laminate including a Ti, an AL and a Cu is stacked on the beam.

13. The acceleration sensor according to claim 1, further comprising a bonding agent interposed between the sensor chip and the silicon chip, wherein the bonding agent is made of photosensitive material.

* * * * *